United States Patent [19]
Peterson

[11] Patent Number: 5,060,237
[45] Date of Patent: Oct. 22, 1991

[54] MULTI-BEAM LASER DIODE ARRAY

[75] Inventor: David L. Peterson, Pittsford, N.Y.

[73] Assignee: Eastman Kodak Company, Rochester, N.Y.

[21] Appl. No.: 632,826

[22] Filed: Dec. 24, 1990

[51] Int. Cl.⁵ .............................................. H01S 3/19
[52] U.S. Cl. ...................................... 372/50; 372/49; 372/99
[58] Field of Search ...................... 372/50, 45, 99, 44, 372/49

[56] References Cited

U.S. PATENT DOCUMENTS

| | | | |
|---|---|---|---|
| 3,921,096 | 11/1975 | Chenausky et al. | 372/50 |
| 3,996,492 | 12/1976 | McGroddy | 313/500 |
| 3,996,528 | 12/1976 | Blum et al. | 372/50 |
| 4,163,953 | 8/1979 | Springthorpe | 372/50 |
| 4,216,485 | 8/1980 | Page | 357/19 |
| 4,633,476 | 12/1986 | Scifres et al. | 372/45 |
| 4,719,635 | 1/1988 | Yeh | 372/50 |
| 4,730,325 | 3/1988 | Chow | 372/44 |
| 4,760,578 | 7/1988 | Oshima et al. | 372/45 |
| 4,956,844 | 9/1990 | Goodhue et al. | 372/99 |

OTHER PUBLICATIONS

"Vertically Emitting Laser with Integrated Non-Absorbing Mirror Deflector", IBM Technical Disclosure Bulletin, vol. 32, No. 3B, Aug. 1989.

Primary Examiner—Georgia Epps
Attorney, Agent, or Firm—Raymond L. Owens

[57] ABSTRACT

There is disclosed herein a laser diode array including a plurality of laser diode bodies on a surface of a substrate. Each of the bodies has therein a semiconductor junction which is capable of generating light in the body when a suitable voltage is placed thereacross which junction extends to an end surface of the body. An end surface of each body is angled back under the body at an angle of 45° with respect to the substrate surface and is reflective so that the light generated in the body is reflected by the end surface out of the body away from and substantially perpendicularly to the substrate. The bodies are arranged on the substrate with the angled end surfaces being adjacent to and facing each other so that the array provides a plurality of closely spaced, substantially parallel light beams emitted therefrom.

20 Claims, 2 Drawing Sheets

MULTI-BEAM LASER DIODE ARRAY

FIELD OF THE INVENTION

The present invention relates to a multi-beam laser diode array, and, more particularly, to such an array in which the emitted beams are closely spaced.

BACKGROUND OF THE INVENTION

Laser diodes are semiconductor devices which emit a beam of substantially coherent light. Such devices, in general, comprise a body of a semiconductor material having therein a semiconductor p-n junction and a waveguide region adjacent the junction. When a suitable voltage is placed across the body, opposite charge carriers are generated across the junction which recombine in the waveguide to create light. Spaced reflectors are provided along the waveguide to create a cavity along which the light is reflected back and forth to form a substantially coherent beam. Generally, the light beam is emitted from one or both ends of the waveguide. However, laser diodes have been designed in which the light beam is emitted from a surface of the waveguide.

Laser diodes are used as a source of light in various applications, such as optical communication systems, computers and printers. For some of these applications, it is desirable to have a light emitting device which emits a plurality of closely spaced light beams. For this purpose, arrays of a plurality of the laser diodes have been built in a single body of semiconductor material. However, a problem in building such an array is to be able to have the emitted beams close together while providing the necessary electrical and thermal isolation between adjacent laser diodes in the array. Also, for some applications, it is desirable to have an array which emits a plurality of beams of different wavelengths.

SUMMARY OF THE INVENTION

The present invention is drawn to an array of laser diodes in which a plurality of laser diode bodies are formed on a single substrate. Each of the bodies has an end surface which is positioned closely adjacent an end surface of the other bodies and which is adapted to reflect light generated in the body through a surface of the body away from the substrate. The bodies may be made of different semiconductor materials which generate light of different wavelengths.

More particularly, the present invention is directed to a laser diode array. The laser diode array comprises a substrate of a semiconductor material having a surface and a plurality of bodies of a semiconductor material on the substrate surface. Each of the bodies has a semiconductor junction therein for generating light when a suitable voltage is placed thereacross and a reflecting end surface at an end of the junction which is angled to reflect light generated in the body out of the body substantially perpendicular to and away from the substrate. The angled end surfaces of said bodies are close to and facing each other.

The invention will be better understood from the following more detailed description taken with the accompanying drawings.

It should be understood that the drawings are not necessarily all drawn to scale.

DETAILED DESCRIPTION

Figure 1:
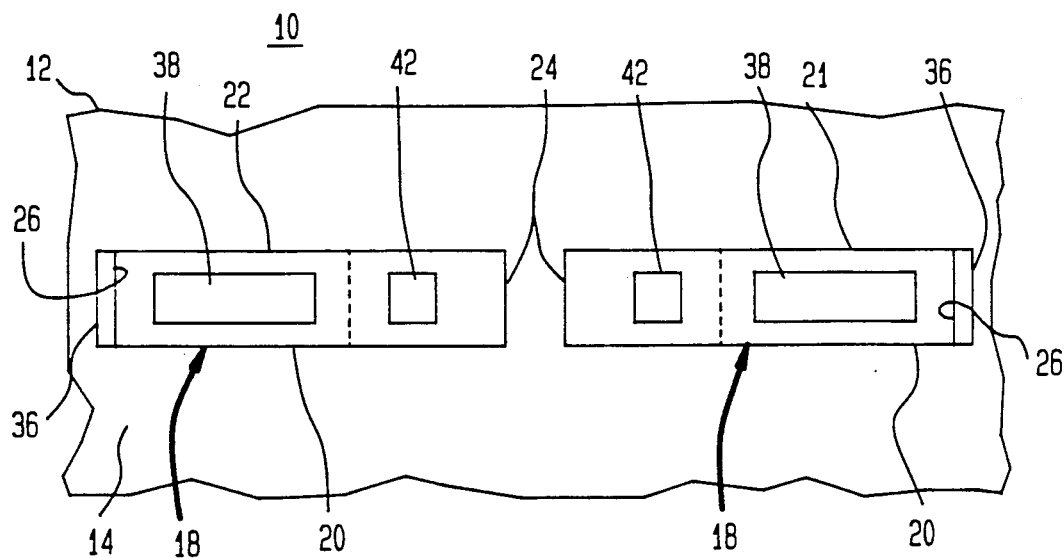
FIG. 1 is a top plan view of a laser diode array of the present invention.
Figure 2:
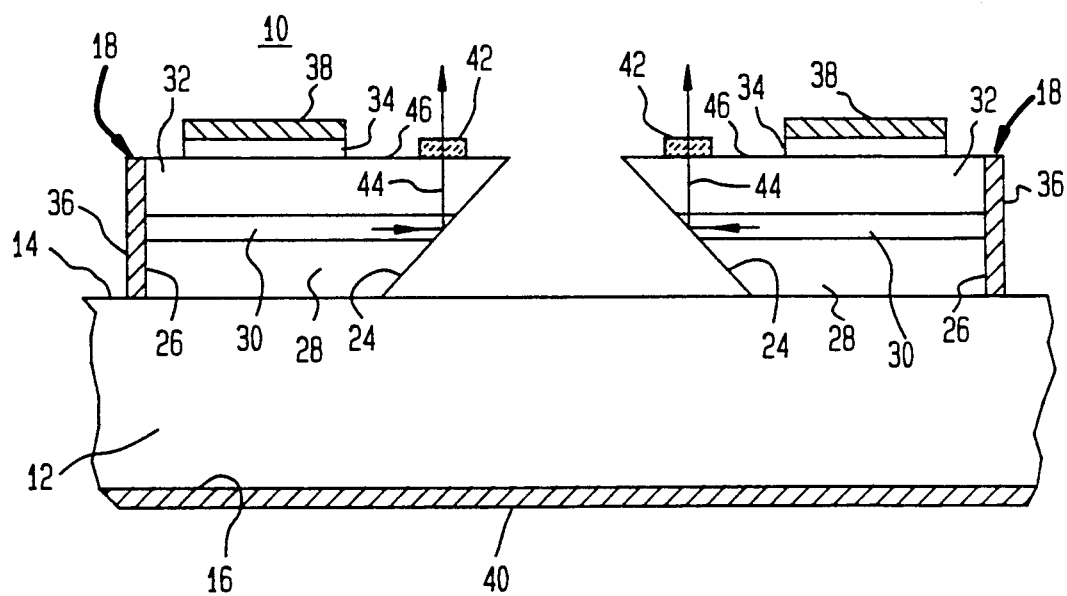
FIG. 2 is a sectional view taken along line 2—2 of FIG. 1.

Referring now to FIGS. 1 and 2, there is shown a top plan view and a sectional view, respectively, of a laser diode array 10 of the present invention. Laser diode array 10 comprises a substrate 12 of a semiconductor material, such as gallium arsenide (GaAs) having a pair of opposed surfaces 14 and 16. On the surface 14 of the substrate 12 are a plurality of laser diode bodies 18. In the array 10 shown, there are two laser diode bodies 18. Each of the laser diode bodies 18 is rectangular having a pair of opposed side surface 20 and 22, and end surfaces 24 and 26. The bodies 18 are positioned on the substrate 12 with their end surfaces 24 facing each other and in close adjacent spaced relation.

As shown in FIG. 2, each of the bodies 18 comprises a bottom cladding layer 28 of a semiconductor material of one conductivity type, such as n-type, an active waveguide layer 30 of a semiconductor material on the bottom cladding layer 28, a top cladding layer 32 of a semiconductor material of the opposite conductivity type, such as p-type, on the waveguide layer 30, and a capping layer 34 of a semiconductor material of the opposite conductivity type on the top cladding layer 32. The active waveguide layer 30 may be of either conductivity type or may be undoped so as to be intrinsic. Thus, there is provided between the bottom and top cladding layers 28 and 32 a semiconductor junction. The active waveguide layer 30 is preferably of a semiconductor material different from that of the bottom and top cladding layers 28 and 32 so as to form heterojunctions between the active waveguide layer 30 and each of the bottom and top cladding layers 28 and 32. The heterojunctions provide charges in the index of refraction so that any light generated in the waveguide layer 30 will be retained therein to permit the formation of a substantially coherent light beam. For example, if the bottom and top layers 28 and 32 are of aluminum gallium arsenide (AlGaAs), the waveguide layer may be of gallium arsenide or aluminum gallium arsenide having a smaller content of aluminum than the materials of the bottom and top layers 28 and 32. The capping layer 34, which is of the same conductivity type as the top cladding layer 32 may be of the same semiconductor material as the top cladding layer 32 or may be of gallium arsenide. The substrate 12 is of a conductivity type the same as that of the bottom cladding layer 28.

As shown in FIG. 2, the end surface 26 of each of the bodies 18 may be substantially perpendicular to the substrate surface 14. However, the end surface 24 of each of the bodies 18 is cut back under the body 18 so that it is at an angle of about 45° with respect to the substrate surface 14. This forms a body 18 in which the top cladding layer 32 is longer than the bottom cladding layer 28. The reflectivities of the end surfaces 26 may be altered to suit a particular application, such as by coating them with an end reflection layer 36 of one or more dielectric or metallic films. On a surface of capping layer 34 of each body 18 is a conductive contact 38, such as of a metal, and on the surface 16 of the substrate 12 is a conductive contact 40, such as of a metal. On a top surface 46 of the top cladding layer 32 and over the angled end surface 24 may be a layer 42 of reflectivity altering material. If desired, the space between the angled end surfaces 24 of the two bodies 13 may be filled with a dielectric material with a sufficiently low index of refraction to planarize the array 10.

In the operation of the array 10, a suitable voltage is placed across each of the bodies 18 between the contacts 38 and 40. This results in the creation of charge carriers across the semiconductor junction into the active waveguide layer 30. The charge carriers recombine in the active waveguide layer 30 to create light. The light is confined to the cavity formed in the active waveguide layer 30 by the heterojunctions between the active waveguide layer 30 and each of the cladding layers 28 and 32. The light is reflected back and forth in the folded optical cavity formed by the active waveguide layer 30, the total internal reflecting surface 24 and the top cladding layer 32. The end surfaces 26 and 46 form the end reflectors of this optical cavity. The light is emitted out of the body 18 as a substantially coherent beam as indicated by the arrow 44 in FIG. 2. The properties of this folded optical cavity may be adjusted by altering the structure of the end reflecting layers 36 and 42. Since there is a separate light beam emitted from each body 18 in the array 10, the array 10 provides a pair of substantially parallel light beams in close relation to each other. As will be explained later, the array 10 can be made with the end surfaces 24 of the bodies 18 being very close to each other, a spacing of about 3 micrometers between the top edges of the bodies 18, so that the beams can also be very close, a center-to-center spacing of about 5 micrometers. Thus the array 10 provides a plurality of closely spaced, parallel beams of light.

To make the array 10, the layers 28, 30, 32 and 34 are deposited on the substrate surface 14 in succession. The semiconductor layers can be deposited by any well known epitaxial technique, such as liquid phase epitaxy (LPE), vapor phase epitaxy (VPE) or a metal-organic chemical vapor deposition (MOCVD). The top layer is then defined using well known photolithographic and etching techniques to form the capping layers 34. Then the other layers are defined in the same manner to form the body 18 having the sides surfaces 20 and 22 and end surfaces 26. To form the body 18, the etching of the layers may be by a chemical etch or by ion beam etching in a reactive gas. The end surfaces 24 are then etched to form the angled end surfaces 24. This is achieved by ion beam etching in a reactive gas with the device being positioned to direct the ion beam at an appropriate angle with respect to the end surfaces 24 to achieve the 45° angle. The metal contacts 38 and 40 and the reflective layer 36 can then be deposited by any well known deposition technique, such as vacuum deposition or sputtering. Since the bodies 18 are defined using etching techniques, the end surfaces 24 can be readily made very close to each other.

Although the array 10 is shown in FIGS. 1 and 2 as being formed of two laser diodes 18, it can be formed of any number of the laser diodes.

Figure 3:
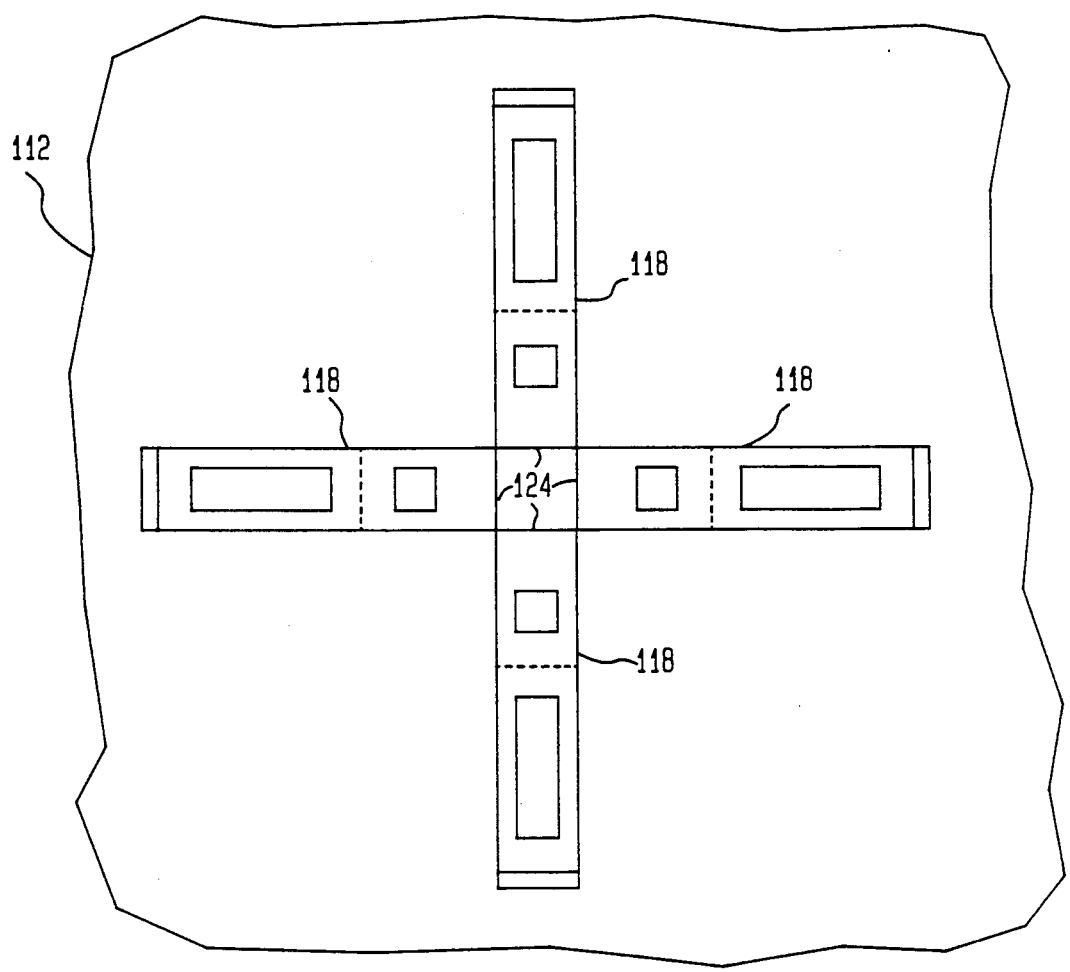
FIG. 3 is a top plan view of a modification of the diode array of the present invention.

Referring now to FIG. 3, there is shown a top plan view of an array 100 formed of four laser diode bodies 118 in accordance with the present invention. Each of the bodies 118 is of the same structure as a body 18 of the array 10 shown in FIGS. 1 and 2. However, the angled end surfaces 124 of the four bodies 118 are arranged along the sides of a square so as to be facing each other. Thus, the array 100 will emit four beams of light which are substantially parallel to each other and are closely spaced from each other. The area between the angled end surfaces 124 of the laser diode bodies 118 can be filled with a dielectric material of sufficiently low index of refraction. The spacing between the laser diode bodies 118 electrically and thermally isolate the laser diode bodies 118 from each other.

Instead of having only four laser diode bodies 118, the array 100 can have any desired number of the bodies 118. No matter how many laser diode bodies 118 the array 100 has, the tapered end surfaces 124 are of bodies 118 must be arranged facing each other around a closed path so that the emitted light beams will be close together. Also, the arrays 10 and 100 have been described with all of the laser diode bodies being formed of the same semiconductor material so that the light beams emitted from each body is of the same wavelength. If desired, one or more of the bodies can be made of a different semiconductor material, such as a different composition of aluminum gallium arsenide, or different active layer 30, such as quantum well which emits a light beam of a different wavelength. This can produce an array which emits a plurality of closely spaced light beams which are of different wavelengths.

Thus, there is provided by the present invention an array of a plurality of laser diodes which emits a plurality of substantially parallel light beams which are closely spaced from each other. The array can contain any desired number of the laser diodes so long as they are arranged with their angled end surfaces facing each other along a closed path. Also, the laser diode bodies can be made of different semiconductor materials so as to emit light at different wavelengths. This provides an array which emits light beams of different colors.

It is to be appreciated and understood that the specific embodiments of the invention are merely illustrative of the general principles of the invention. Various modifications may be made consistent with the principles set forth. For example, the laser diode bodies can be formed of other structures which will provide a semiconductor junction and a waveguide cavity. Also, the laser diode bodies can be made of other semiconductor materials which are known to be capable of generating light.

What is claimed is:

1. A laser diode array comprising:
    a substrate of a semiconductor material having a surface; and
    a plurality of bodies of a semiconductor material on said substrate surface, each of said bodies having a semiconductor junction therein for generating light when a suitable voltage is placed thereacross and a reflecting end surface at an end of the junction which is angled to reflect light generated in the body out of the body substantially perpendicular to and away from the substrate, said angled end surfaces of said bodies being close to and facing each other.

2. The laser diode array of claim 1 in which said end surfaces of each of the bodies extends back under the body from the top thereof.

3. The laser diode array of claim 2 in which said end surfaces of each of the bodies is at an angle of 45° with respect to the surface of the substrate.

4. The laser diode array of claim 3 in which each of said bodies is substantially rectangular having a pair of opposed side surfaces and a pair of end surfaces with at least one of said end surface being angled at 45° with respect to the substrate surface and facing an angled surface of the other bodies.

5. The laser diode array of claim 4 in which each of said bodies comprises a bottom cladding layer of one conductivity type on said substrate surface, a top cladding layer of the opposite conductivity type over said bottom cladding layer and an active waveguide layer between the cladding layers.

6. The laser diode array of claim 5 in which the cladding layers are of a semiconductor material different from that of the active waveguide layer so as to form light confining heterojunctions between the waveguide layer and the cladding layer.

7. The laser diode array of claim 6 further comprising a conductive contact on the top cladding layer of each of the bodies and a conductive contact on a surface of the substrate opposite said one surface.

8. The laser diode array of claim 7 further comprising a capping layer of a semiconductor material of the same conductivity type as the top cladding layer on the top cladding layer and the conductive contact is on the capping layer.

9. The laser diode array of claim 8 further comprising a layer of dielectric or metallic films on the top cladding layer over the angled end surface and through which the light passes to effect the reflectivity of the emitting surface.

10. The laser diode array of claim 9 further comprising a layer of dielectric or metallic films on the end surface of the bodies opposite to the angled surfaces to effect the refectivity of the surface.

11. A laser diode array comprising:
a substrate of a semiconductor material of one conductivity type having a pair of opposed surfaces;
four laser diode bodies of a semiconductor material on one of said substrate surfaces, each of said bodies having a semiconductor junction extending thereacross which is capable of generating light when a suitable voltage is placed across the junction and a reflecting end surface at one end of the junction which is angled back under the body toward the one substrate surface at a 45° angle to deflect the light generated in the body out of the body substantially perpendicular to and away from the substrate; and the bodies are arranged on the substrate so that the angled surface of the bodies are adjacent to and face each other.

12. The laser diode array of claim 11 in which the bodies are arranged on the substrate so that the angled surface of the bodies extend along a separate side of a rectangle.

13. The laser diode array of claim 12 in which each of said bodies is substantially rectangular having a pair of opposed side surfaces and a pair of end surfaces with at least one of said end surfaces being the angled surface.

14. The laser diode array of claim 13 in which each of said bodies comprises a bottom cladding layer of the one conductivity type, a top cladding layer of the opposite conductivity type over the bottom cladding layer and an active waveguide layer between the cladding layers.

15. The laser diode array of claim 14 in which the cladding layers are of a semiconductor material different from that of the active waveguide layer so as to form a light confining heterojunction between the active waveguide layer and each of the cladding layers.

16. The laser diode array of claim 15 further comprising a conductive contact on the top cladding layer of each of the bodies and a conductive contact on the other surface of the substrate.

17. The laser diode array of claim 16 further comprising a capping layer of a semiconductor material of the same conductivity type as that of the to cladding layer between the top cladding layer and the conductive contact.

18. The laser diode array of claim 17 further comprising a layer of dielectric or metallic films on the top cladding layer over the angled surface through which the light passes to effect the reflectivity of the emitting surface.

19. The laser diode array of claim 18 further comprising a layer of dielectric or metallic films on the end surface of the bodies opposite to the angled surfaces to effect the refectivity of the surface.

20. The laser diode array of claim 18 in which at least one of the bodies is of a semiconductor material which generates light of a wavelength different from that generated by the other bodies.

* * * * *